(12) United States Patent
Xiao et al.

(10) Patent No.: US 10,204,579 B2
(45) Date of Patent: Feb. 12, 2019

(54) GOA CIRCUITS, DISPLAY DEVICES AND THE DRIVING METHODS OF THE GOA CIRCUITS

(71) Applicants: Shenzhen China Star Optoelectronics Technology Co., Ltd., Shenzhen, Guangdong (CN); Wuhan China Star Optoelectronics Technology Co., Ltd., Wuhan, Hubei (CN)

(72) Inventors: Juncheng Xiao, Guangdong (CN); Shangcao Cao, Guangdong (CN); Ronglei Dai, Guangdong (CN); Yao Yan, Guangdong (CN)

(73) Assignees: Shenzhen China Star Optoelectronics Technology Co., Ltd, Shenzhen, Guangdong (CN); Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 378 days.

(21) Appl. No.: 14/889,423

(22) PCT Filed: Oct. 21, 2015

(86) PCT No.: PCT/CN2015/092363
§ 371 (c)(1),
(2) Date: Nov. 5, 2015

(87) PCT Pub. No.: WO2017/049687
PCT Pub. Date: Mar. 30, 2017

(65) Prior Publication Data
US 2017/0169784 A1    Jun. 15, 2017

(30) Foreign Application Priority Data

Sep. 23, 2015 (CN) .......................... 2015 1 0613238

(51) Int. Cl.
*G11C 19/28* (2006.01)
*G09G 3/36* (2006.01)
*H01L 27/12* (2006.01)

(52) U.S. Cl.
CPC ......... *G09G 3/3677* (2013.01); *H01L 27/124* (2013.01); *G09G 2300/0408* (2013.01);
(Continued)

(58) Field of Classification Search
None
See application file for complete search history.

(56) References Cited

U.S. PATENT DOCUMENTS 8,041,000 B2   10/2011  Moon et al.
2008/0219401 A1*  9/2008  Tobita .................. G09G 3/3677
                                                        377/79
(Continued)

FOREIGN PATENT DOCUMENTS

CN    1755783 A    4/2006
CN    202771779 U    3/2013
(Continued)

*Primary Examiner* — Tuan T Lam
(74) *Attorney, Agent, or Firm* — Andrew C. Cheng (57) ABSTRACT

A GOA circuit, a display device, and a driving method of GOA circuit are disclosed. A N-th level GOA unit is configured for charging the N-th level horizontal scanning line (G(N)) within a display area of the display device. The N-th level horizontal scanning line (G(N)) connects to GAS. In response to the GAS, the horizontal scanning lines corresponding to all of the GOA units are in a charging state. In this way, the horizontal scanning lines at each level are connected to the GAS, such that when the GAS are valid, the corresponding horizontal scanning line at each level are in the charging state of in an on-state so as to realize the All Gate On function.

13 Claims, 5 Drawing Sheets

(52) U.S. Cl.
CPC .......... *G09G 2300/0426* (2013.01); *G09G 2310/0251* (2013.01); *G09G 2310/0286* (2013.01); *G09G 2310/061* (2013.01); *G09G 2310/08* (2013.01); *G11C 19/28* (2013.01)

(56) References Cited

U.S. PATENT DOCUMENTS

| | | | |
|---|---|---|---|
| 2009/0058787 A1 | 3/2009 | Weng et al. | |
| 2010/0259525 A1* | 10/2010 | Ohkawa | G09G 3/20 345/211 |
| 2013/0155044 A1* | 6/2013 | Ohkawa | G09G 3/3677 345/211 |
| 2013/0156148 A1* | 6/2013 | Sasaki | G11C 19/184 377/64 |
| 2015/0015558 A1 | 1/2015 | Sasaki et al. | |
| 2016/0005372 A1 | 1/2016 | Yu | |
| 2016/0071614 A1* | 3/2016 | Lee | G09G 5/006 345/214 |
| 2016/0155409 A1* | 6/2016 | Jeoung | G09G 5/003 345/214 |
| 2016/0189586 A1 | 6/2016 | Zou et al. | |
| 2016/0307531 A1 | 10/2016 | Xiao | |
| 2016/0322115 A1* | 11/2016 | Xu | G11C 19/28 |
| 2016/0358564 A1* | 12/2016 | Xiao | G09G 3/20 |
| 2016/0358568 A1* | 12/2016 | Xiao | G09G 3/3674 |
| 2016/0358572 A1* | 12/2016 | Xiao | G11C 19/287 |
| 2017/0025068 A1* | 1/2017 | Jeoung | G11C 19/28 |
| 2017/0140728 A1* | 5/2017 | Zhao | G09G 3/3677 |
| 2017/0162148 A1* | 6/2017 | Xiao | G09G 3/3674 |
| 2017/0162150 A1* | 6/2017 | Xiao | G09G 3/3677 |
| 2017/0169783 A1* | 6/2017 | Xiao | G09G 3/3677 |
| 2017/0193944 A1* | 7/2017 | Xiao | G09G 3/3677 |
| 2017/0193956 A1* | 7/2017 | Xiao | G09G 3/3696 |
| 2017/0256217 A1* | 9/2017 | Xiao | G09G 3/3677 |
| 2017/0256219 A1* | 9/2017 | Xiao | G09G 3/3677 |
| 2017/0301302 A1* | 10/2017 | Zhao | G09G 3/3677 |
| 2017/0323605 A1* | 11/2017 | Xiao | G09G 3/3614 |

FOREIGN PATENT DOCUMENTS

| | | |
|---|---|---|
| CN | 104766584 A | 7/2015 |
| GB | 2452278 A | 3/2009 |

* cited by examiner

FIG 7 configuring the GOA circuit to be a plurality cascaded GOA units, and configuring a N-th level GOA unit to charge N-th level horizontal scanning line (G(N)) within a display area of the display device

801 connecting the N-th level horizontal scanning line (G(N)) with GAS in All Gate On state, and in response to the GAS, the horizontal scanning lines corresponding to all of the GOA units are in the charging state; and wherein N is a positive integer larger than or equal to one

GOA CIRCUITS, DISPLAY DEVICES AND THE DRIVING METHODS OF THE GOA CIRCUITS

BACKGROUND OF THE INVENTION

1. Field of the Invention

The present disclosure relates to liquid crystal display technology, and more particularly to a GOA circuit, a display device, and a driving method of GOA circuit.

2. Discussion of the Related Art

Gate Driver On Array or Gate on Array (GOA) circuit adopts conventional TFT LCD array manufacturing process to configure the gate-line-row-scanning-driving-signals on the array substrate so as to realize the driving method of scanning the gate lines row by row. Compared with the conventional COF or COG technology, not only the cost is reduced, but also the bonding process with respect to the gate may be omitted. As such, not only the productivity may be enhanced, but the density of the integration may be enhanced.

In real scenario, display devices usually have to operate cooperatively with the functions of the touch panel. Thus, the GOA circuit needs to suspend the signals so as to cooperate with the functions of the touch panel, such as scanning the touch panel.

Under general conditions, after the GOA circuit suspends the signals, the display device needs to be woken up by a black screen. At this moment, the GOA circuit may need a period of time to configure all of the gate lines to be charged or be in the on-state. By applying the black voltage to the data lines, the residual level within the pixel capacitor may be cleaned out so as to obtain good display performance. This period is called as All Gate On stage. However, the conventional GOA circuit may fail when the All Gate On stage function is executed, and thus is unstable.

In view of the above, the conventional GOA circuit is not capable of providing the All Gate On requirement.

SUMMARY

The object of the invention is to provide a GOA circuit, a display device, and a driving method of GOA circuit for stably implementing the All Gate On function.

In one aspect, a GOA circuit for driving display devices includes: a plurality of cascaded GOA units, a N-th level GOA unit is configured for charging the N-th level horizontal scanning line (G(N)) within a display area of the display device, the N-th level horizontal scanning line (G(N)) connects to Gate All Selected Signals (GAS), in response to the GAS, the horizontal scanning lines corresponding to all of the GOA units are in a charging state, wherein N is a positive integer larger than or equal to one.

Wherein the N-th level GOA unit includes a full-on controlling module, the full-on controlling module includes a first transistor, a gate and a source of the first transistor are short-connected and connect to the GAS, and a drain of the first transistor connects with the N-th level horizontal scanning line (G(N)).

Wherein the N-th level GOA unit includes a level module having a second transistor, a gate of the second transistor connects with a N-th level gate signals point (Q(N)), a source of the second transistor connects with first clock signals (CK(N)), when the N-th level gate signals point (Q(N)) turns on the second transistor, the first clock signals (CK(N)) operates as the level signals (STN(N)) passing through a drain of the second transistor and then the first clock signals (CK(N)) are transmitted to the GOA unit at the next level.

Wherein the N-th level GOA unit includes a N-th level pull-up controlling module, a N-th level pull-up module, a N-th level pull-down module, and a N-th level pull-down maintaining module; an output end of the N-th level pull-up controlling module connects to the N-th level gate signals point (Q(N)); an input end of the N-th level pull-up module connects to the N-th level gate signals point (Q(N)), a control end of the N-th level pull-up module receives the first clock signals (CK(N)), an output end of the N-th level pull-up module connects to the N-th level horizontal scanning line (G(N)); an input end of the N-th level pull-down module connects with the N-th level pull-down controlling signals point (P(N)), a control end of the N-th level pull-down module connects with first voltage signals, an output end of the N-th level pull-down module connects to the N-th level gate signals point (Q(N)) and the N-th level horizontal scanning line (G(N)); a control end of the N-th level pull-down maintaining module connects with second clock signals (CK(N+1)) or third clock signals (CK(N−1)), and an output end of the N-th level pull-down maintaining module connects to the N-th pull-down controlling signals (P(N)); wherein the N-th level pull-up controlling module outputs the pull-up control signals to the N-th level gate signals point such that, in response to the pull-up control signals, the N-th level pull-up module outputs the first clock signals (CK(N)) to the N-th level horizontal scanning line (G(N)), when the N-th level horizontal scanning line (G(N)) is charged after in response to the first clock signals (CK(N)), the N-th level pull-down maintaining module outputs the second clock signals (CK(N+1)) or the third clock signals (CK(N−1)) to the N-th level pull-down controlling signals point (P(N)), such that the N-th level pull-down module transmits the first voltage signals respectively to the N-th level gate signals point (Q(N)) and the N-th level horizontal scanning line (G(N)) to turn off the N-th level horizontal scanning line (G(N)), the N-th level pull-down maintaining module maintains the N-th level horizontal scanning line (G(N)) to be in an off-state in response to the second clock signals (CK(N+1)) or the third clock signals (CK(N−1)).

Wherein the N-th level pull-up controlling module includes a third transistor, a fourth transistor, and a fifth transistor; a gate of the third transistor receives forward scanning signals (U2D), a source of the third transistor connects to the horizontal scanning line (G(N−2)) at the previous level, and a drain of the third transistor connects with a source of the fifth transistor; a gate of the fourth transistor receives backward scanning signals (D2U), a source of the fourth transistor connects with the horizontal scanning line (G(N+2)) at the next level, and a drain of the fourth transistor connects with the source of the fifth transistor; and a gate of the fifth transistor receives fourth clock signals (CK(N−2)), and a drain of the fifth transistor connects with the N-th level gate signals point (Q(N)).

Wherein the N-th level pull-up module includes a sixth transistor and a first capacitor; a gate of the sixth transistor connects with the N-th level gate signals point (Q(N)), a source of the sixth transistor receives the first clock signals (CK(N)), and a drain of the sixth transistor connects with the N-th level horizontal scanning line (G(N)); and one end of the first capacitor connects with the gate of the sixth transistor, and the other end of the first capacitor connects with the N-th level horizontal scanning line (G(N)).

Wherein the N-th level pull-down module includes a seventh transistor and an eighth transistor; a gate of the eighth transistor connects with the N-th level pull-down controlling signals point (P(N)), a source of the eighth transistor receives the first voltage signals, and a drain of the eighth transistor connects with the N-th level gate signals point (Q(N)); a gate of the eighth transistor connects with the N-th level pull-down controlling signals point (P(N)), a source of the eighth transistor receives the first voltage signals, and a drain of the eighth transistor connects with the N-th level horizontal scanning line (G(N)); the N-th level pull-down maintaining module includes a ninth transistor a tenth transistor, and an eleventh transistor; a gate of the tenth transistor connects to the forward scanning control signals (U2D), a source of the tenth transistor connects with the second clock signals (CK(N+1)), a drain of the tenth transistor connects with a gate of the eleventh transistor; a gate of the tenth transistor connects to the backward scanning signals (D2U), a source of the tenth transistor receives the third clock signals (CK(N−1)), a drain of the tenth transistor connects with the gate of the eleventh transistor; and a source of the eleventh transistor receives the second voltage signals, and a drain of the eleventh transistor connects with the N-th level pull-down controlling signals point (P(N)).

Wherein the N-th level GOA unit includes a pull-down maintaining module having a twelveth transistor, a gate of the twelveth transistor receives the GAS, a source of the twelveth transistor receives the first voltage signals, a drain of the twelveth transistor connects with the N-th level pull-down controlling signals point (P(N)).

In another aspect, a display device includes the above GOA circuit.

In another aspect, a driving method of GOA circuits for driving display devices, includes: configuring the GOA circuit to be a plurality cascaded GOA units, and configuring a N-th level GOA unit to charge N-th level horizontal scanning line (G(N)) within a display area of the display device; connecting the N-th level horizontal scanning line (G(N)) with GAS in All Gate On state, and in response to the GAS, the horizontal scanning lines corresponding to all of the GOA units are in the charging state; and wherein N is a positive integer larger than or equal to one.

In view of the above, the GOA circuit includes a plurality of cascaded GOA units. The N-th level GOA unit is configured for charging the N-th level horizontal scanning line (G(N)) within the display area. The N-th level horizontal scanning line (G(N)) connects to the GAS. As such, in response to the GAS, the N-th level horizontal scanning line (G(N)) corresponding to all of the GOA units are in the charging state. Compared to the conventional technology, by connecting the horizontal scanning lines at each level with the GAS, when the GAS are valid, the corresponding horizontal scanning lines at each level may be in the charging state or in the on-state, so as to stably implement the All Gate On function.

DETAILED DESCRIPTION OF THE EMBODIMENTS

Embodiments of the invention will now be described more fully hereinafter with reference to the accompanying drawings, in which embodiments of the invention are shown.

Figure 1:
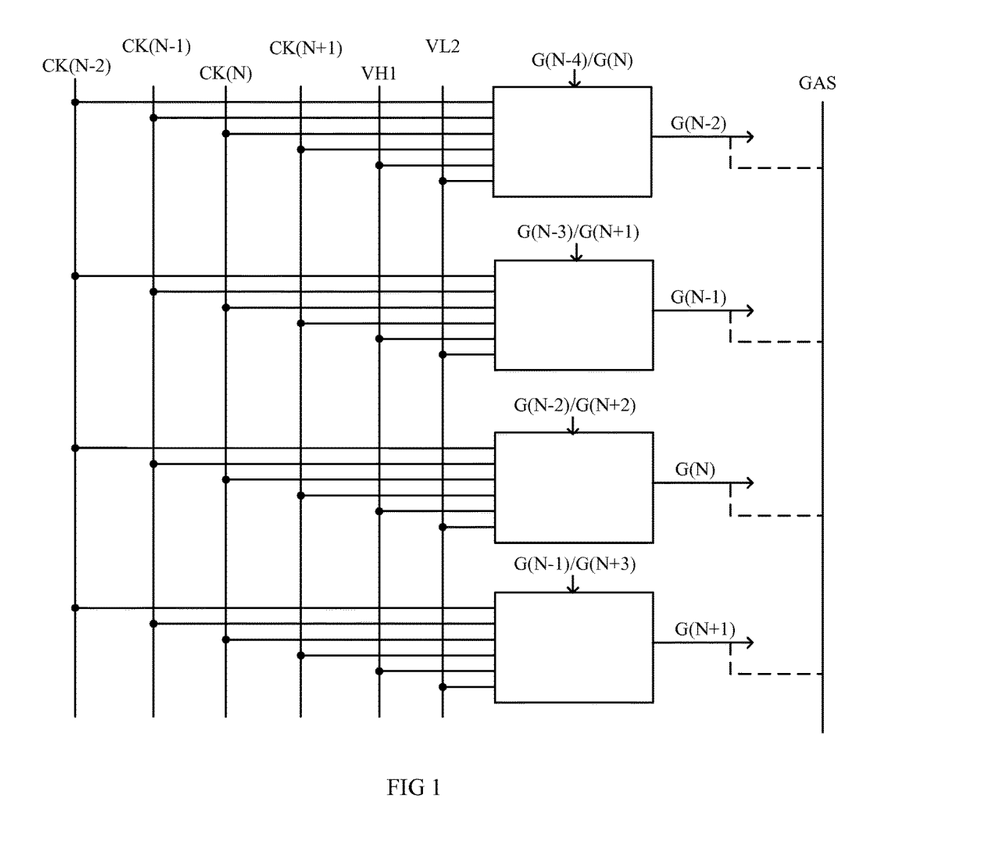
FIG. 1 is a schematic view of the connected GOA units of the GOA circuit in accordance with one embodiment.

FIG. 1 is a schematic view of the connected GOA units of the GOA circuit in accordance with one embodiment. As shown in FIG. 1, the GOA circuit includes a plurality of cascaded GOA units. The N-th level GOA unit is configured for charging the N-th level horizontal scanning line (G(N)) within a display area of the display device. The N-th level horizontal scanning line (G(N)) connects to a GAS. In response to the GAS, the horizontal scanning lines corresponding to all of the GOA units are in a charging state, wherein N is a positive integer larger than or equal to one.

FIG. 1 shows four GOA units at (N−2)-th level, (N−1)-th level, N-level, and (N+1)-th level respectively connecting to four pulse signals CK(N−2), CK(N−1), CK(N), and CK(N+1) and first voltage signals (VH1) and second voltage signals (VL2). The four GOA units are driven by scanning the interleaved rows. Further, in the embodiment, a forward scanning driven method and a backward scanning driven method may be included. When the forward scanning driven method is adopted, the level signals or trigger signals (gate signals) inputted to the input ends of GOA units at the (N−2)-th level, (N−1)-th level, N-th level, and (N+1)-th level are respectively the signals on the horizontal scanning lines (G(N−4)), (G(N−3)), (G(N−2)) and (G(N−1)) of the GOA units at the (N−4)-th level, (N−3)-th level, (N−2)-th level and the (N−1)-th level.

When the backward scanning driven method is adopted, the level signals or trigger signals (gate signals) inputted to the input ends of GOA units at the (N−2)-th level, (N−1)-th level, N-th level, and (N+1)-th level are respectively the signals on the horizontal scanning lines (G(N)), (G(N+1)), (G(N+2)) and (G(N+3)) of the GOA units at the (N)-th level, (N+1)-th level, (N+2)-th level and the (N+3)-th level.

Figure 2:
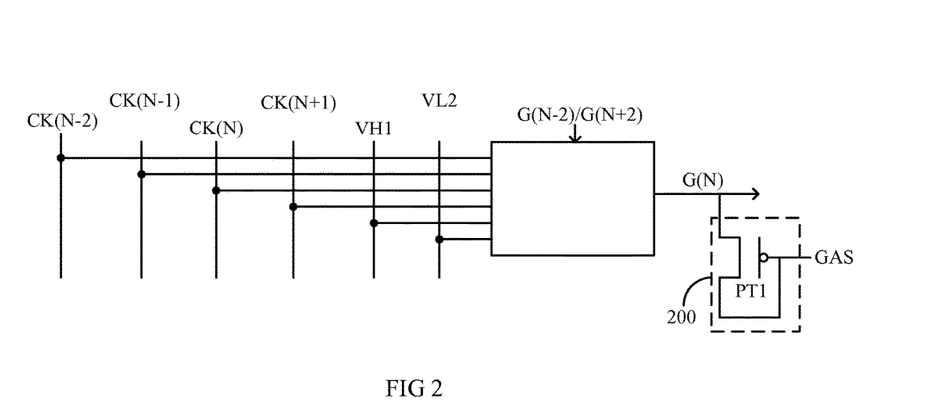
FIG. 2 is a schematic view of the circuit of the GAS and the GOA unit at N-th level of FIG. 1.

FIG. 2 is a schematic view of the circuit of the GAS and the GOA unit at N-th level of FIG. 1. As shown in FIG. 2, the GOA unit at N-th level includes a full-on controlling module 200 having a first transistor (PT1). In the present disclosure, the P-type Junction Field Effect Transistor (JFET) is taken as one example. The gate and the source of the first transistor (PT1) are short-connected and connect to the GAS. The drain of the first transistor (PT1) connects with the horizontal scanning line (G(N)) at N-th level.

It can be understood that when the GAS are at low level, the first transistor (PT1) is turned on, and the GAS of the source are transmitted to the drain, that is, the horizontal scanning line (G(N)) at N-th level is also at low level such that the horizontal scanning lines at the N-th level are all turned on and are all in a charging state. Similarly, in the All Gate On stage, the GAS are controlled to turn on all of the horizontal scanning lines corresponding to the GOA units or to control all of the horizontal scanning lines to be in the charging state. As such, a black voltage is applied to the data line to clear the residual level within the pixel capacitor so as to realize the All Gate On function.

Figure 3:
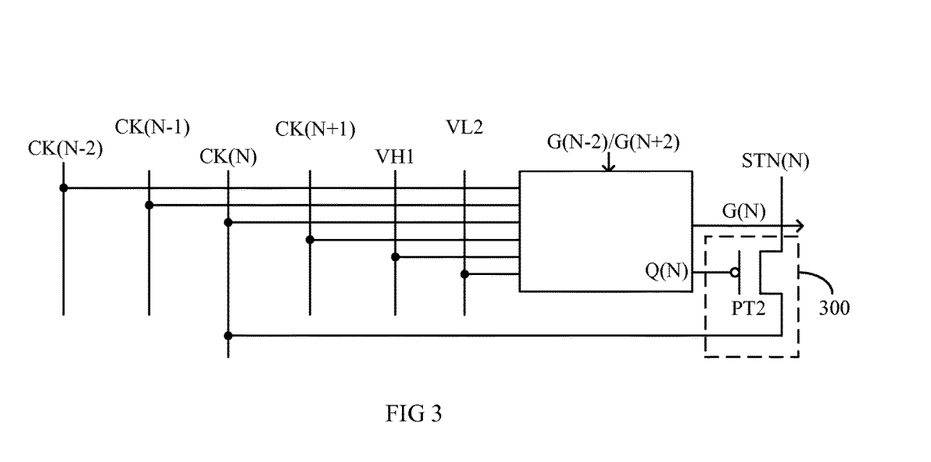
FIG. 3 is a schematic view of the circuit of the level-transfer module and the GOA unit at the N-th level of FIG. 1.

FIG. 3 is a schematic view of the circuit of the level-transfer module and the GOA unit at the N-th level of FIG. 1. As shown in FIG. 3, the GOA unit at the N-th level includes a level module 300 having a second transistor (PT2). The gate of the second transistor (PT2) connects with the gate signals point (Q(N)) at N-th level. The source of the second transistor (PT2) connects with the first clock signals (CK(N)). When the gate signals point (Q(N)) at N-th level turns on the second transistor (PT2), the first clock signals (CK(N)) operates as the level signals (STN(N)) passing through the drain of the second transistor (PT2) and then are transmitted to the GOA unit at the next level.

In combination with the row-scanning driving method, it can be understood that the first clock signals (CK(N)) operating as the level signals (STN(N)) are transmitted to the GOA unit at the (N−2)-th or the (N+2)-th level via the drain of the second transistor (PT2).

In the embodiment, the level signals (STN(N)) are transmitted to the GOA unit at the next level to avoid the level transmission errors resulting from that the level of the scanning line cannot be reset after entering the normal displaying state.

Figure 4:
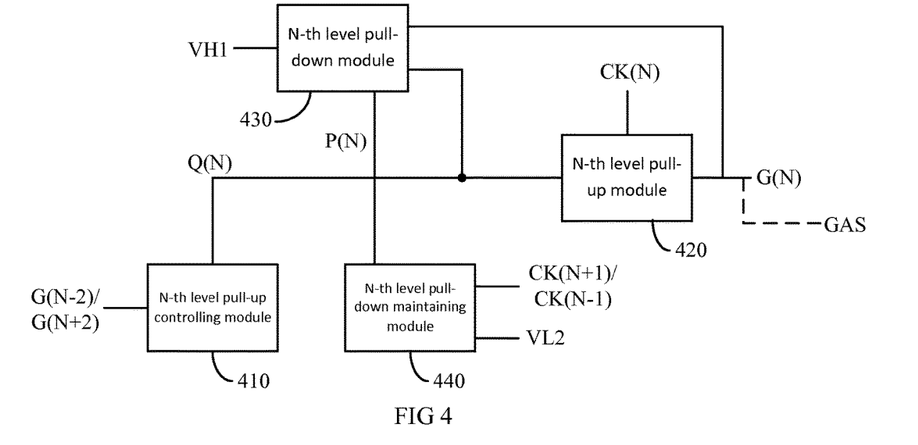
FIG. 4 is a schematic view of the circuit of the GOA unit at the N-th level of FIG. 1.

FIG. 4 is a schematic view of the circuit of the GOA unit at the N-th level of FIG. 1. As shown in FIG. 4, the GOA unit at N-th level includes a N-th level pull-up controlling module 410, a N-th level pull-up module 420, a N-th level pull-down module 430, and a N-th level pull-down maintaining module 440. The output end of the N-th level pull-up controlling module 410 connects to the N-th level gate signals point (Q(N)). The input end of the N-th level pull-up module 420 connects to the N-th level gate signals point (Q(N)). The control end of the N-th level pull-up module 420 receives the first clock signals (CK(N)). The output end of the N-th level pull-up module 420 connects to the horizontal scanning line (G(N)) at N-th level. The input end of the N-th level pull-down module 430 connects with the N-th level pull-down controlling signals point (P(N)), the control end of the N-th level pull-down module 430 connects with the first voltage signals (VH1), the output end of the N-th level pull-down module 430 connects to the N-th level gate signals point (Q(N)) and the N-th level horizontal scanning line (G(N)). The control end of the N-th level pull-down maintaining module 440 connects with the second clock signals (CK(N+1)) or the third clock signals (CK(N−1)), and the output end of the N-th level pull-down maintaining module 440 connects to the N-th pull-down controlling signals (P(N)).

In normal displaying stage, the N-th level pull-up controlling module 410 outputs the pull-up control signals to the N-th level gate signals point (Q(N)) such that, in response to the pull-up control signals, the N-th level pull-up module 420 outputs the first clock signals (CK(N)) to the N-th level horizontal scanning line (G(N)). After the N-th level horizontal scanning line (G(N)) response to the first clock signals (CK(N)), the N-th level pull-down maintaining module 440 outputs the second clock signals (CK(N+1)) or the third clock signals (CK(N−1)) to the N-th level pull-down controlling signals point (P(N)). As such, the N-th level pull-down module 430 transmits the first voltage signals (VH1) to the N-th level gate signals point (Q(N)) and the N-th level horizontal scanning line (G(N)). Further, in response to the second clock signals (CK(N+1)) or the third clock signals (CK(N−1)), the N-th level pull-down main-taining module 440 controls the N-th level horizontal scanning line (G(N)) to remain in the off-state.

When the display device is in the normal displaying stage, the input end of the pull-up controlling module 410 of the GOA unit at the N-th level connects to the level signals or gate signals transmitted from the GOA unit at the previous level, such as the (N+2)-th level or the (N−2)-th level for controlling turn-on time of the pull-up module 420. The N-th level pull-up module 420, in response to the pull-up control signals, outputs the first clock signals (CK(N)) to the N-th level horizontal scanning line (G(N)) to turn on the horizontal scanning line. As such, a grayscale voltage needed to display a previous frame is applied to the corresponding data line. When the sub-pixel 行 receives the grayscale voltage and to display, the N-th level pull-down maintaining module 440, in response to the second voltage signals (VL2), outputs the second clock signals (CK(N+1)) and the third clock signals (CK(N−1)) to the N-th level pull-down controlling signals point (P(N)). Further, the N-th level pull-down module 430 configures the N-th level horizontal scanning line (G(N)) to be in the off-state until first horizontal scanning line at the N-th level is turned on when displaying the next frame.

In the embodiment, the GOA circuit is illustrated by taking the P-type field effect tube (FET) as one example. The first voltage signals (VH1) are at high level, and the second voltage signals (VL2) are at low level.

Figure 5:
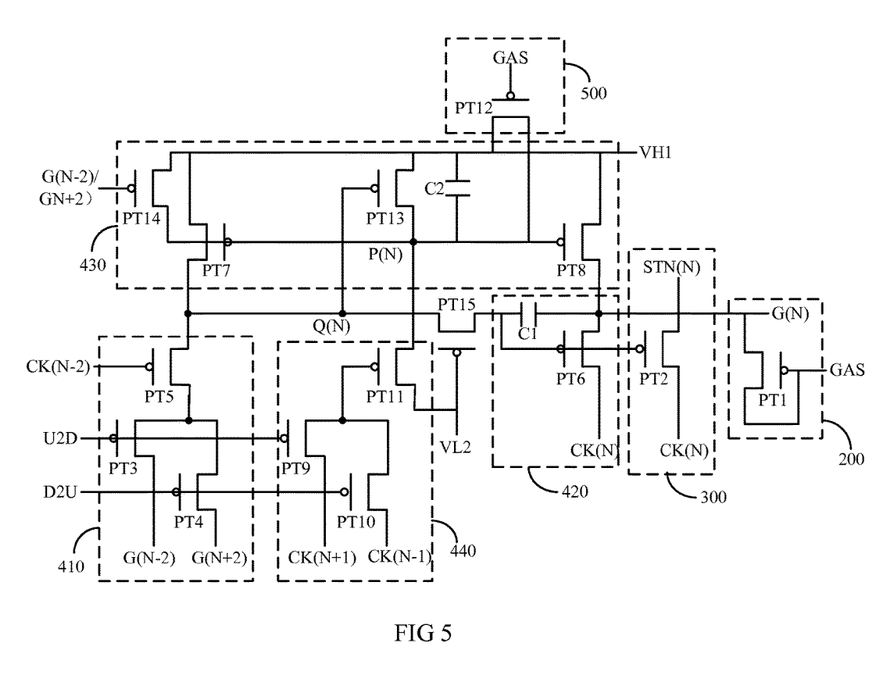
FIG. 5 is a schematic view of the circuit of the GOA unit at the N-th level of FIG. 4.

FIG. 5 is a schematic view of the circuit of the GOA unit at the N-th level of FIG. 4. The N-th level pull-up controlling module 410 includes a third transistor (PT3), a fourth transistor (PT4), and a fifth transistor (PT5).

A gate of the third transistor (PT3) receives forward scanning signals (U2D), the source of the third transistor (PT3) connects to the horizontal scanning line at the previous level, i.e., (N−2)-th level, and the drain of the third transistor (PT3) connects with the source of the fifth transistor (PT5).

The gate of the fourth transistor (PT4) receives the backward scanning signals (D2U), the source of the fourth transistor (PT4) connects with the horizontal scanning line at the next level, i.e., (N+2)-th level, and the drain of the fourth transistor (PT4) connects with the source of the fifth transistor (PT5).

The gate of the fifth transistor (PT5) receives the fourth clock signals (CK(N−2)), and the drain of the fifth transistor (PT5) connects with the N-th level gate signals point (Q(N)).

Wherein the N-th level pull-up module 420 includes a sixth transistor (PT6) and a first capacitor (C1).

A gate of the sixth transistor (PT6) connects with the N-th level gate signals point (Q(N)), a source of the sixth transistor (PT6) receives the first clock signals (CK(N)), and the drain of the sixth transistor (PT6) connects with the N-th level horizontal scanning line (G(N)).

One end of the first capacitor (C1) connects with the gate of the sixth transistor (PT6), and the other end of the first capacitor (C1) connects with the N-th level horizontal scanning line (G(N)).

Wherein the N-th level pull-down module 430 includes a seventh transistor (PT7) and an eighth transistor (PT8).

The gate of the eighth transistor (PT7) connects with the N-th level pull-down controlling signals point (P(N)), the source of the eighth transistor (PT7) receives the first voltage signals (VH1), and the drain of the eighth transistor (PT7) connects with the N-th level gate signals point (Q(N)).

A gate of the eighth transistor (PT8) connects with the N-th level pull-down controlling signals point (P(N)), a source of the eighth transistor (PT8) receives the first voltage signals (VH1), and a drain of the eighth transistor (PT8) connects with the N-th level horizontal scanning line (G(N)).

A second capacitor (C2) may be arranged between the first voltage signals (VH1) and the N-th level pull-down controlling signals point (P(N)) to maintain and store the level of the N-th level pull-down controlling signals point (P(N)).

The N-th level pull-down maintaining module 440 includes a ninth transistor (PT9) a tenth transistor (PT10), and an eleventh transistor (PT11).

A gate of the tenth transistor (PT9) connects to the forward scanning control signals (U2D), a source of the tenth transistor (PT9) connects with the second clock signals (CK(N+1)), a drain of the tenth transistor (PT9) connects with the gate of the eleventh transistor (PT11).

A gate of the tenth transistor (PT10) connects to the backward scanning signals (D2U), a source of the tenth transistor (PT10) receives the third clock signals (CK(N−1)), a drain of the tenth transistor (PT10) connects with the gate of the eleventh transistor (PT11).

A source of the eleventh transistor (PT11) receives the second voltage signals (VL2), and the drain of the eleventh transistor (PT11) connects with the N-th level pull-down controlling signals point (P(N)).

FIG. 5 also shows that the GOA unit at N-th level includes the full-on controlling module 200 and the level module 300. The GOA unit at N-th level includes a pull-down maintaining module 500 having a twelveth transistor (PT12). The gate of the twelveth transistor (PT12) receives the GAS, a source of the twelveth transistor (PT12) receives the first voltage signals (VH1), a drain of the twelveth transistor (PT12) connects with the N-th level pull-down controlling signals point (P(N)). The pull-down maintaining module 500 is for the All Gate on stage. Due to the GAS, the N-th pull-down controlling signals (P(N)) of the N-th level pull-down module 430 is at the high level of the first voltage signals (VH1). As such, the eighth transistor (PT8) and the tenth transistor (PT10) are turned off or in the off-stage. Further, the N-th level horizontal scanning line (G(N)) is only affected by the full-on controlling module 200 of the GOA unit.

After passing the All Gate On stage and entering the normal displaying stage, in order to increase the stability of the GOA circuit, a thirteenth transistor (PT13) and a fourteenth transistor (PT14) are configured within the pull-down module at each levels to stabilize the level of each of the nodes within the GOA unit. Specifically, as shown in FIG. 5, a gate of the thirteenth transistor (PT13) connects to the N-th level gate signals point (Q(N)), a drain of the thirteenth transistor (PT13) receives the first voltage signals (VH1), a source of the thirteenth transistor (PT13) connects to the N-th level pull-down controlling signals point (P(N)). The gate of the fourteenth transistor (PT14) connects to the horizontal scanning line of the GOA unit at the previous level. When driven by the forward scanning driven method, the gate of the fourteenth transistor (PT14) connects with the (N−2)-th level horizontal scanning line (G(N−2)).

When driven by the backward scanning driven method, the gate of the fourteenth transistor (PT14) connects with the (N+2)-th level horizontal scanning line (G(N+2)). The drain of the fourteenth transistor (PT14) receives the first voltage signals (VH1), the source of the fourteenth transistor (PT14) connects with the N-th level pull-down controlling signals point (P(N)).

In addition, in order to reduce the leaked current between the N-th level gate signals point (Q(N)) and the first capacitor (C1), a fifteenth transistor (PT15) is configured. Specifically, a gate of the fifteenth transistor (PT15) connects with the second voltage signals (VL2) such that the fifteenth transistor (PT15) always in the on-state. The drain and the source of the fifteenth transistor (PT15) respectively connects with the N-th level gate signals point (Q(N)) and the first capacitor (C1).

Figure 6:
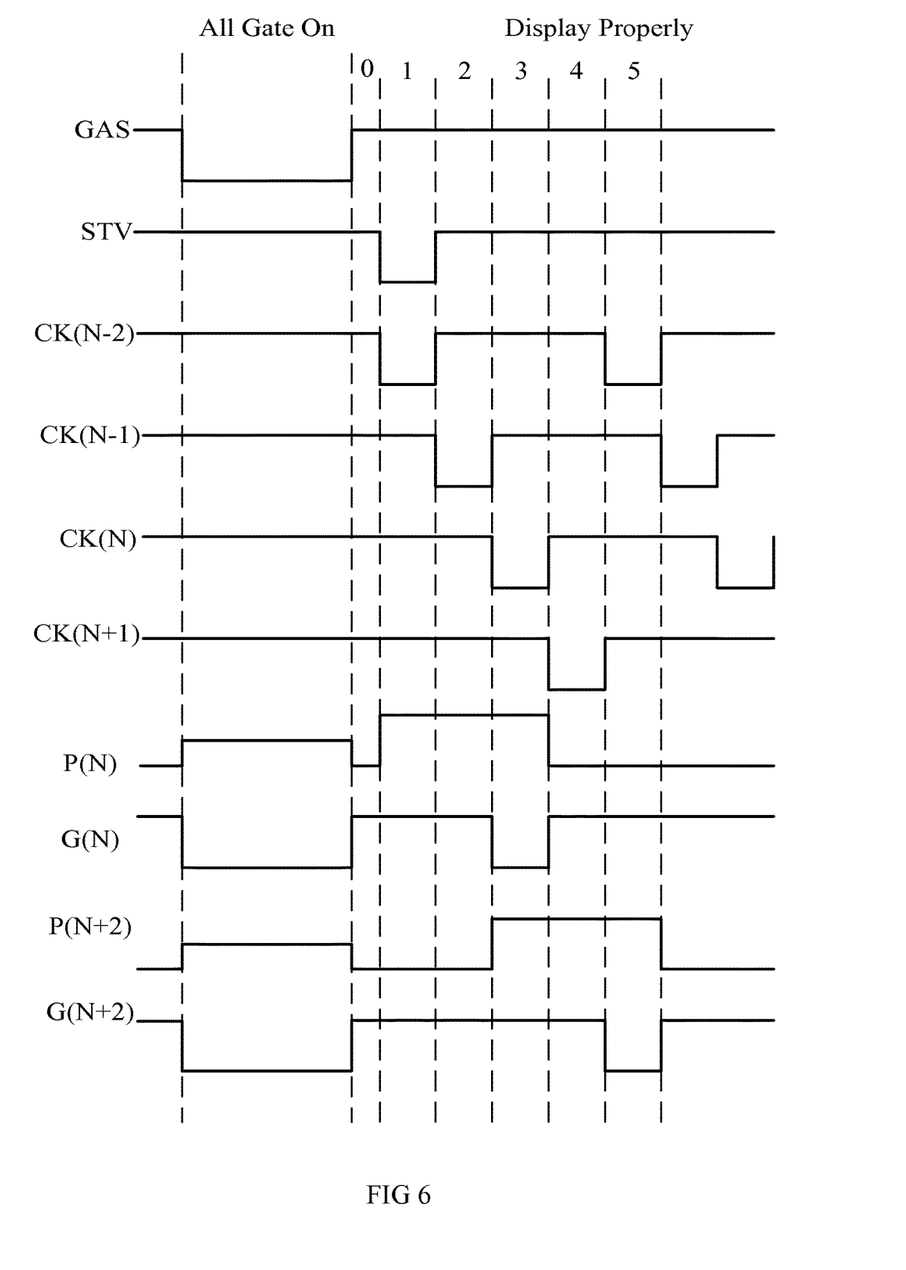
FIG. 6 is a waveform diagram of the corresponding signals of the GOA unit at the N-th level in the All-Gate-On stage and a normal displaying stage of FIG. 5.

FIG. 6 is a waveform diagram of the corresponding signals of the GOA unit at the N-th level in the All-Gate-On stage and a normal displaying stage of FIG. 5.

As shown in FIG. 6, the four pulse signals, including CK(N−2), CK(N−1), CK(N), CK(N+1), are at the high level. At this moment, the GAS are at low level such that the first transistor (PT1) and the twelveth transistor (PT12) are turned on. The N-th level pull-down controlling signals point (P(N)) are the first voltage signals (VH1), and are at the high level. As such, the eighth transistor (PT7) and the eighth transistor (PT8) are turned off. The N-th level horizontal scanning line (G(N)) are GAS, and are in the charging state so as to turn on the scanning line.

Similarly, in the All Gate On stage, the circuit structure of the GOA units at each of the levels are similar. The connection methods of the four pulse signals are different. The duty cycle ratio of the four pulse signals are respectively ¼ of the pulse period, and the adjacent pulse signals are arranged in an interleaved manner. That is, the CK(N) and the CK(N+4i) are the same pulse signals, and i is an integer. For instance, the CK(N−2), CK(N−1), CK(N), CK(N+1) are respectively the same with CK(N+2), CK(N+3), CK(N+4), CK(N+5). Thus, in response to the GAS, the GOA units at each level may control the corresponding scanning line to be in the charging state or full-on stage, so as to realize the All Gate On stage function.

Referring to FIG. 6, after passing the All Gate On stage and entering the normal displaying stage, which is shown as "Display Properly," the GAS are at high level. There are totally five periods to accomplish the pull-up controlling, pull-up maintaining, pull-up, pull-down, and pull-down maintaining operations of the GOA unit at the N-th level, wherein the STV signals are the frame-starting signals.

Also referring to FIG. 5, the forward scanning driven method is taken as one example. That is, the forward scanning control signals (U2D) are at the low level, and the backward scanning signals (D2U) are at the high level. The first period is the pull-up controlling period. The pull-up controlling module 410 receives the signals from the horizontal scanning line of the previous level, i.e., the horizontal scanning line (G(N−2)) of the GOA unit at the (N−2)-th level, or receives the level signals (STN(N−2)) of the GOA unit at the previous level, which are at the low level. As the forward scanning driven method is adopted, the third transistor (PT3) is turned on, and the drain is at low level, at this moment, the CK(N−2) are also at low level such that the fifth transistor (PT5) is turned on. Further, the N-th level gate signals point (Q(N)) is at low level. As the first clock signals (CK(N)) are at high level, the N-th level horizontal scanning line cannot be charged even though the scanning driving circuit 520 transmits the first clock signals (CK(N)) to the N-th level horizontal scanning line. At the same time, even though the level module 300 transmits the first clock signals (CK(N)) to the GOA unit at the next level, the level of each of the nodes within the GOA unit at the next level will not be affected. Thus, the GOA circuit is stable.

In addition, the thirteenth transistor (PT13) and the fourteenth transistor (PT14) are turned on such that the N-th level pull-down controlling signals point (P(N)) are the first voltage signals (VH1), which are at high level. The eighth transistor (PT7) and the eighth transistor (PT8) are turned off such that the level of each of the nodes of the GOA unit at N-th level is stable.

The second period is a pull-up maintaining period. At this moment, the fourth clock signals (CK(N−2)) are at high level, and the fifth transistor (PT5) and the fourteenth transistor (PT14) are turned off. The level of each of the nodes within the GOA unit remains the same.

The third period is a pull-up period. At this moment, the first clock signals (CK(N)) are at low level. As the fifteenth transistor (PT15) is always in the on-state, the sixth transistor (PT6) transmits the first clock signals (CK(N)) to the N-th level horizontal scanning line (G(N)) to turn on the horizontal scanning line.

It can be understood that the second transistor of the level module 300 adopts the first clock signals (CK(N)) as the level signals (STN(N)) and then transmits the level signals (STN(N)) to the GOA unit at next level, i.e., the pull-up controlling circuit of the GOA unit at the (N+2)-th level.

The fourth period is a pull-down period. At this moment, the tenth transistor (PT9) transmits the low level signals of the second clock signals (CK(N+1)) to the gate of the eleventh transistor (PT11). The eleventh transistor (PT11) is in the on-state. The low level of the second voltage signals (VL2) is transmitted to the N-th level pull-down controlling signals point (P(N)) such that the eighth transistor (PT7) and the eighth transistor (PT8) are turned on. Further, the N-th level gate signals point (Q(N)) and the N-th level horizontal scanning line (G(N)) are the high level of the first voltage signals (VH1). As such, the N-th level horizontal scanning line (G(N)) are in the off-state.

The fifth period is the pull-down maintaining period. At this moment, the second clock signals (CK(N+1)) are at the high level and the eleventh transistor (PT11) is turned off. The level of each of the nodes within the GOA unit remains the same until the next frame has to be driven by the horizontal scanning line and the process enters the first to the fifth periods of the normal displaying stage.

It can be understood that after passing the All Gate On stage and entering the normal displaying stage, the horizontal scanning lines at each levels have to be reset, and thus are turned off or are in the off-state. As shown in FIG. 6, the zero-period is the reset period. Usually, the N-th level pull-down controlling signals point (P(N)) are controlled to be at low level such that the eighth transistor (PT7) and the eighth transistor (PT8) are turned on. Further, the high level of the first voltage signals (VH1) is transmitted to the N-th level gate signals point (Q(N)) and the N-th level horizontal scanning line (G(N)).

FIG. 6 also shows the level changes of the (N+2)-th level pull-down controlling signals point (P(N)) and the (N+2)-th level horizontal scanning line (G(N+2)) in the All Gate On stage and the normal displaying stage. Specifically, in the All Gate On stage, in response to the GAS at low level, the horizontal scanning line is turned on to clear the residual level. In the normal displaying stage, the fourth clock signals (CK(N−2)), which is the same with the CK(N+2), turns on the horizontal scanning line so as to conduct the normal grayscale display of the pixel cells connected with the scanning line.

When the N-th level GOA unit is driven by the backward scanning driving, the forward scanning control signals (U2D) are at high level, and the backward scanning signals (D2U) are at low level. The change of the nodes of the GOA units at each levels are similar to the above and thus are omitted hereinafter.

In other embodiments, the transistors in the GOA circuit may be N-type FET, P-type MOS-FET, N-type MOS-FET. When the transistor is of the P-type, the level of each of the nodes is the same with the level change when the forward scanning driven method is adopted. When the transistor is of N-type, the level of each of the nodes is opposite to the level change when the forward scanning driven method is adopted. The first voltage signals (VH1) and the second voltage signals (VL2) are opposite to the level when the forward scanning driven method is adopted. That is, when the transistor is of N-type, the first voltage signals (VH1) is at low level and the second voltage signals (VL2) is at high level.

Figure 7:
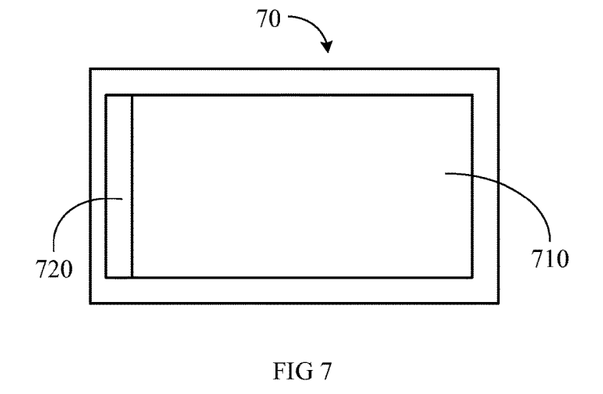
FIG. 7 is a schematic view of the display device in accordance with one embodiment.

FIG. 7 is a schematic view of the display device in accordance with one embodiment. The display device 70 includes the GOA circuit as described in the above.

In particular, the display device 70 is a liquid crystal device or a LED display including a display panel 710 and a GOA circuit 720 as described above.

Figure 8:
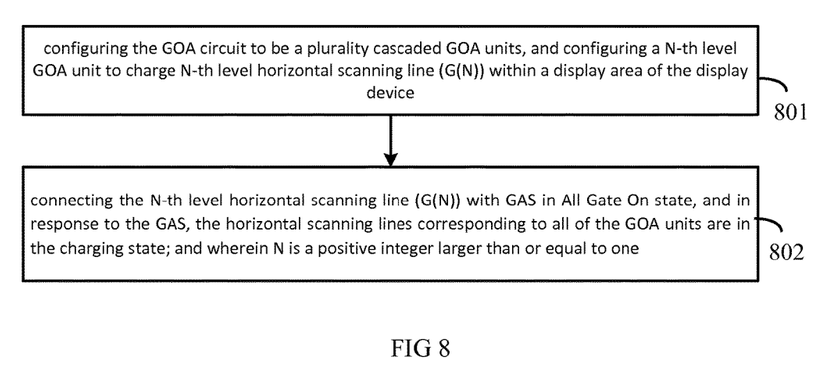
FIG. 8 is a flowchart of the driving method of the GOA circuit in accordance with one embodiment.

FIG. 8 is a flowchart of the driving method of the GOA circuit in accordance with one embodiment. The structure and the function of the GOA circuit in FIG. 8 are similar to the GOA circuit 720 of the above display device. The driving method includes the following steps.

In block S801, the GOA circuit is configured to be a plurality cascaded GOA units, and the GOA unit at the N-th level is configured to charge the N-th level horizontal scanning line (G(N)) within the display area of the display device.

In block S802, in the All Gate on stage, the N-th level horizontal scanning line (G(N)) is connected with the GAS. In response to the GAS, the horizontal scanning lines corresponding to all of the GOA units are in the charging state.

Wherein N is a positive integer larger than or equal to one.

In block S802, the step of connecting the N-th level horizontal scanning line (G(N)) with the GAS further includes short-connecting the gate and the source of the first transistor and receiving the GAS. At the same time, the drain of the first transistor is connected with the N-th level horizontal scanning line (G(N)).

It can be understood that when the first transistor is of the P-type transistor and the GAS are at low level, the first transistor is turned on. In addition, the level of the drain and the source are the same and the GAS are at low level. At the moment, the N-th level horizontal scanning line (G(N)) are at low level so as to be in the charging state or in the on-state.

Further, in the All Gate On stage, the GAS are configured to be at high level such that the GOA unit may display normally.

After the block S802, the driving method further includes the following steps. During the normal displaying stage, the N-th level pull-up controlling module outputs the pull-up controlling signals to the N-th level gate signals point (Q(N)). In response to the pull-up control signals, the pull-up module outputs the first clock signals (CK(N)) to the N-th level horizontal scanning line. After the N-th level horizontal scanning line (G(N)) has charged in response to the first clock signals (CK(N)), the N-th level pull-down maintaining module outputs the second clock signals (CK(N+1)) or the third clock signals (CK(N−1)) to the N-th level pull-down controlling signals point (P(N)).

The pull-down module transmits the first voltage signals to the N-th level gate signals point (Q(N)) and the N-th level horizontal scanning line (G(N)) in accordance with the level of the N-th level pull-down controlling signals point (P(N)) so as to turn off the N-th level horizontal scanning line (G(N)).

The N-th pull-down maintaining module maintains the N-th level horizontal scanning line (G(N)) in the off-state in accordance with the second clock signals (CK(N+1)) or the third clock signals (CK(N−1)).

The N-th level pull-up controlling module, the N-th level pull-up module, the N-th level pull-down level, the N-th level pull-down maintaining module are the same with the N-th level pull-up controlling module 410, the N-th level N-th level pull-up module 420, the N-th level N-th level pull-down module 430, and the N-th level N-th level pull-down maintaining module 440 of the GOA circuit, and are capable of executing the functions of each of the modules in the normal displaying stage.

During the normal displaying stage, before the step of outputting the pull-up control signals to the N-th level gate signals point (Q(N)) from the N-th pull-up controlling module, the driving method further includes: resetting the N-th level horizontal scanning line so as to be turned off or in the off-state.

Wherein before the step of, in response to the pull-up module, outputting the first clock signals (CK(N)) to the N-th level horizontal scanning line (G(N)) by the pull-up module, the method further includes:

Connecting the gate of the second transistor with the N-th level gate signals point (Q(N)), and connecting the source of the second transistor with the first clock signals (CK(N)). When the N-th level gate signals point (Q(N)) turns on the second transistor, the first clock signals (CK(N)) are adopted as the level signals (STN(N)) and are transmitted to GOA unit at the next level via the drain of the second transistor.

Further, when the block 802 is executed, the driving method further includes the following steps:

In the All Gate On stage, the gate of the twelveth transistor is turned on via the GAS, and the source of the twelveth transistor receives the first voltage signals, and then the first voltage signals are transmitted to the N-th level pull-down controlling signals point (P(N)) such that the pull-down module, the N-th level gate signals point (Q(N)), and the N-th level horizontal scanning line (G(N)) are turned off. Referring to the above disclosure, by configuring the pull-down module, the N-th level gate signals point (Q(N)), and the N-th level horizontal scanning line (G(N)) to be in the off-state, the seventh and the eighth transistor connected with the pull-down module and the N-th level pull-down controlling signals point (P(N)) are turned off. In the embodiment, the seventh transistor and the eighth transistor are turned off such that the level of each of the nodes within the GOA circuit are stable during the All Gate On stage.

In view of the above, the GOA circuit includes a plurality of cascaded GOA units. The N-th level GOA unit is configured for charging the N-th level horizontal scanning line (G(N)) within the display area. In the All Gate On stage, the N-th level horizontal scanning line (G(N)) connects to the GAS. As such, in response to the GAS, the N-th level horizontal scanning line (G(N)) corresponding to all of the GOA units are in the charging state. At the same time, a gate of the twelveth transistor is configured to connect with the GAS to stabilize the level of the N-th level pull-down controlling signals point (P(N)). In normal displaying stage, the charging state and the off-state after the charging state are accomplished via the N-th level pull-up controlling module, the N-th level pull-up module, the N-th level pull-down module and the N-th level pull-down maintaining module. In addition, level signals are configured to connect with the clock signals, which avoids the level transmission errors caused for the reason that the horizontal scanning line cannot be reset.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A GOA circuit for driving display devices, comprising:
a plurality of cascaded GOA units, a N-th level GOA unit is configured for charging the N-th level horizontal scanning line (G(N)) within a display area of the display device, the N-th level horizontal scanning line (G(N)) connects to gate all selected signals (GAS), in response to the GAS, the horizontal scanning lines corresponding to all of the GOA units are in a charging state, wherein N is a positive integer larger than or equal to one;
wherein the N-th level GOA unit comprises a N-th level pull-down module, an input end of the N-th level pull-down module connects with a N-th level pull-down controlling signals point (P(N)), a control end of the N-th level pull-down module connects with first voltage signals, an output end of the N-th level pull-down module connects to the N-th level gate signals point (Q(N)) and the N-th level horizontal scanning line (G(N));
the N-th level pull-down module comprises a fourteenth transistor, wherein a gate of the fourteenth transistor connects to horizontal scanning line of the GOA unit at a previous level, a drain of the fourteenth transistor receives the first voltage signals, and a source of the fourteenth transistor connects with the N-th level pull-down controlling signals point (P(N));
the n-th level GOA unit further comprises a level module having a second transistor connects with a N-th level gate signals point (Q(N)), a source of the second transistor connects with first clock signals (CK(N)), when the N-th level gate signals point (Q(N)) turns on the second transistor, the first clock signals (CK(N)) operates as the level signals (STN(N)) passing through a drain of the second transistor and then the first clock signals (CK(N)) are transmitted to the GOA unit at the next level; and
wherein the N-th level GOA unit comprises a N-th level pull-up controlling module, a N-th level pull-up module, and a N-th level pull-down maintaining module;
an output end of the N-th level pull-up controlling module connects to the N-th level gate signals point (Q(N));
an input end of the N-th level pull-up module connects to the N-th level gate signals point (Q(N)), a control end of the N-th level pull-up module receives the first clock signals (CK(N)), an output end of the N-th level pull-up module connects to the N-th level horizontal scanning line (G(N));
a control end of the N-th level pull-down maintaining module connects with second clock signals (CK(N+1)) or third clock signals (CK(N−1)), and an output end of the N-th level pull-down maintaining module connects to the N-th pull-down controlling signals (P(N)); and
wherein the N-th level pull-up controlling module outputs pull-up control signals to the N-th level gate signals point such that, in response to the pull-up control signals, the N-th level pull-up module outputs the first clock signals (CK(N)) to the N-th level horizontal scanning line (G(N)), when the N-th level horizontal scanning line (G(N)) is charged after in response to the first clock signals (CK(N)), the N-th level pull-down maintaining module outputs the second clock signals (CK(N+1)) or the third clock signals (CK(N−1)) to the N-th level pull-down controlling signals point (P(N)), such that the N-th level pull-down module transmits the first voltage signals respectively to the N-th level gate signals point (Q(N)) and the N-th level horizontal scanning line (G(N)) to turn off the N-th level horizontal scanning line (G(N)), the N-th level pull-down maintaining module maintains the N-th level horizontal scanning line (G(N)) to be in an off-state in response to the second clock signals (CK(N+1)) or the third clock signals (CK(N−1)).

2. The GOA circuit as claimed in claim 1, wherein the N-th level GOA unit comprises a full-on controlling module, the full-on controlling module comprises a first transistor, a gate and a source of the first transistor are short-connected and connect to the GAS, and a drain of the first transistor connects with the N-th level horizontal scanning line (G(N)).

3. The GOA circuit as claimed in claim 1, wherein the N-th level pull-up controlling module comprises a third transistor, a fourth transistor, and a fifth transistor;
  a gate of the third transistor receives forward scanning signals (U2D), a source of the third transistor connects to the horizontal scanning line (G(N−2)) at the previous level, and a drain of the third transistor connects with a source of the fifth transistor;
  a gate of the fourth transistor receives backward scanning signals (D2U), a source of the fourth transistor connects with the horizontal scanning line (G(N+2)) at the next level, and a drain of the fourth transistor connects with the source of the fifth transistor; and
  a gate of the fifth transistor receives fourth clock signals (CK(N−2)), and a drain of the fifth transistor connects with the N-th level gate signals point (Q(N)).

4. The GOA circuit as claimed in claim 3, wherein the N-th level pull-up module comprises a sixth transistor and a first capacitor;
  a gate of the sixth transistor connects with the N-th level gate signals point (Q(N)), a source of the sixth transistor receives the first clock signals (CK(N)), and a drain of the sixth transistor connects with the N-th level horizontal scanning line (G(N)); and
  one end of the first capacitor connects with the gate of the sixth transistor, and the other end of the first capacitor connects with the N-th level horizontal scanning line (G(N)).

5. The GOA circuit as claimed in claim 3, wherein the N-th level pull-down module comprises a seventh transistor and an eighth transistor;
  a gate of the eighth transistor connects with the N-th level pull-down controlling signals point (P(N)), a source of the eighth transistor receives the first voltage signals, and a drain of the eighth transistor connects with the N-th level gate signals point (Q(N));
  a gate of the eighth transistor connects with the N-th level pull-down controlling signals point (P(N)), a source of the eighth transistor receives the first voltage signals, and a drain of the eighth transistor connects with the N-th level horizontal scanning line (G(N));
  the N-th level pull-down maintaining module comprises a ninth transistor a tenth transistor, and an eleventh transistor;

a gate of the tenth transistor connects to the forward scanning control signals (U2D), a source of the tenth transistor connects with the second clock signals (CK(N+1)), a drain of the tenth transistor connects with a gate of the eleventh transistor;
  a gate of the tenth transistor connects to the backward scanning signals (D2U), a source of the tenth transistor receives the third clock signals (CK(N−1)), a drain of the tenth transistor connects with the gate of the eleventh transistor; and
  a source of the eleventh transistor receives the second voltage signals, and a drain of the eleventh transistor connects with the N-th level pull-down controlling signals point (P(N)).

6. The GOA circuit as claimed in claim 5, wherein the N-th level GOA unit comprises a pull-down maintaining module having a twelveth transistor, a gate of the twelveth transistor receives the GAS, a source of the twelveth transistor receives the first voltage signals, a drain of the twelveth transistor connects with the N-th level pull-down controlling signals point (P(N)).

7. A display device, comprising:
  a GOA circuit comprises a plurality of cascaded GOA units, a N-th level GOA unit is configured for charging the N-th level horizontal scanning line (G(N)) within a display area of the display device, the N-th level horizontal scanning line (G(N)) connects to GAS, in response to the GAS, the horizontal scanning lines corresponding to all of the GOA units are in a charging state, wherein N is a positive integer larger than or equal to one;
  wherein the N-th level GOA unit comprises a N-th level pull-down module, an input end of the N-th level pull-down module connects with the N-th level pull-down controlling signals point (P(N)), a control end of the N-th level pull-down module connects with first voltage signals, an output end of the N-th level pull-down module connects to the N-th level gate signals point (Q(N)) and the N-th level horizontal scanning line (G(N));
  the N-th level pull-down module comprises a fourteenth transistor, wherein a gate of the fourteenth transistor connects to horizontal scanning line of the GOA unit at a previous level, a drain of the fourteenth transistor receives the first voltage signals, and a source of the fourteenth transistor connects with the N-th level pull-down controlling signals point (P(N));
  the n-th level GOA unit further comprises a level module having a second transistor connects with a N-th level gate signals point (Q(N)), a source of the second transistor connects with first clock signals (CK(N)), when the N-th level gate signals point (Q(N)) turns on the second transistor, the first clock signals (CK(N)) operates as the level signals (STN(N)) passing through a drain of the second transistor and then the first clock signals (CK(N)) are transmitted to the GOA unit at the next level; and
  wherein the N-th level GOA unit comprises a N-th level pull-up controlling module, a N-th level pull-up module, and a N-th level pull-down maintaining module;
  an output end of the N-th level pull-up controlling module connects to the N-th level gate signals point (Q(N));
  an input end of the N-th level pull-up module connects to the N-th level gate signals point (Q(N)), a control end of the N-th level pull-up module receives the first clock signals (CK(N)), an output end of the N-th level pull-up module connects to the N-th level horizontal scanning line (G(N));

a control end of the N-th level pull-down maintaining module connects with second clock signals (CK(N+1)) or third clock signals (CK(N−1)), and an output end of the N-th level pull-down maintaining module connects to the N-th pull-down controlling signals (P(N)); and wherein the N-th level pull-up controlling module outputs pull-up control signals to the N-th level gate signals point such that, in response to the pull-up control signals, the N-th level pull-up module outputs the first clock signals (CK(N)) to the N-th level horizontal scanning line (G(N)), when the N-th level horizontal scanning line (G(N)) is charged after in response to the first clock signals (CK(N)), the N-th level pull-down maintaining module outputs the second clock signals (CK(N+1)) or the third clock signals (CK(N−1)) to the N-th level pull-down controlling signals point (P(N)), such that the N-th level pull-down module transmits the first voltage signals respectively to the N-th level gate signals point (Q(N)) and the N-th level horizontal scanning line (G(N)) to turn off the N-th level horizontal scanning line (G(N)), the N-th level pull-down maintaining module maintains the N-th level horizontal scanning line (G(N)) to be in an off-state in response to the second clock signals (CK(N+1)) or the third clock signals (CK(N−1)).

8. The display device as claimed in claim 7, wherein the N-th level GOA unit comprises a full-on controlling module, the full-on controlling module comprises a first transistor, a gate and a source of the first transistor are short-connected and connect to the GAS, and a drain of the first transistor connects with the N-th level horizontal scanning line (G(N)).

9. The display device as claimed in claim 8, wherein the N-th level pull-up controlling module comprises a third transistor, a fourth transistor, and a fifth transistor;

a gate of the third transistor receives forward scanning signals (U2D), a source of the third transistor connects to the horizontal scanning line (G(N−2)) at the previous level, and a drain of the third transistor connects with a source of the fifth transistor;

a gate of the fourth transistor receives backward scanning signals (D2U), a source of the fourth transistor connects with the horizontal scanning line (G(N+2)) at the next level, and a drain of the fourth transistor connects with the source of the fifth transistor; and a gate of the fifth transistor receives fourth clock signals (CK(N−2)), and a drain of the fifth transistor connects with the N-th level gate signals point (Q(N)).

10. The display device as claimed in claim 8, wherein the N-th level pull-up module comprises a sixth transistor and a first capacitor;

a gate of the sixth transistor connects with the N-th level gate signals point (Q(N)), a source of the sixth transistor receives the first clock signals (CK(N)), and a drain of the sixth transistor connects with the N-th level horizontal scanning line (G(N)); and one end of the first capacitor connects with the gate of the sixth transistor, and the other end of the first capacitor connects with the N-th level horizontal scanning line (G(N)).

11. The display device as claimed in claim 8, wherein the N-th level pull-down module comprises a seventh transistor and an eighth transistor;

a gate of the eighth transistor connects with the N-th level pull-down controlling signals point (P(N)), a source of the eighth transistor receives the first voltage signals, and a drain of the eighth transistor connects with the N-th level gate signals point (Q(N));

a gate of the eighth transistor connects with the N-th level pull-down controlling signals point (P(N)), a source of the eighth transistor receives the first voltage signals, and a drain of the eighth transistor connects with the N-th level horizontal scanning line (G(N));

the N-th level pull-down maintaining module comprises a ninth transistor a tenth transistor, and an eleventh transistor;

a gate of the tenth transistor connects to the forward scanning control signals (U2D), a source of the tenth transistor connects with the second clock signals (CK(N+1)), a drain of the tenth transistor connects with a gate of the eleventh transistor;

a gate of the tenth transistor connects to the backward scanning signals (D2U), a source of the tenth transistor receives the third clock signals (CK(N−1)), a drain of the tenth transistor connects with the gate of the eleventh transistor; and a source of the eleventh transistor receives the second voltage signals, and a drain of the eleventh transistor connects with the N-th level pull-down controlling signals point (P(N)).

12. The display device as claimed in claim 11, wherein the N-th level GOA unit comprises a pull-down maintaining module having a twelveth transistor, a gate of the twelveth transistor receives the GAS, a source of the twelveth transistor receives the first voltage signals, a drain of the twelveth transistor connects with the N-th level pull-down controlling signals point (P(N)).

13. A driving method of GOA circuits for driving display devices, comprising:

configuring the GOA circuit to be a plurality cascaded GOA units, and configuring a N-th level GOA unit to charge N-th level horizontal scanning line (G(N)) within a display area of the display device;

connecting the N-th level horizontal scanning line (G(N)) with GAS in All Gate On state, and in response to the GAS, the horizontal scanning lines corresponding to all of the GOA units are in the charging state;

wherein N is a positive integer larger than or equal to one;

the N-th level GOA unit comprises a N-th level pull-down module, an input end of the N-th level pull-down module connects with the N-th level pull-down controlling signals point (P(N)), a control end of the N-th level pull-down module connects with first voltage signals, an output end of the N-th level pull-down module connects to the N-th level gate signals point (Q(N)) and the N-th level horizontal scanning line (G(N));

the N-th level pull-down module comprises a fourteenth transistor, wherein a gate of the fourteenth transistor connects to horizontal scanning line of the GOA unit at a previous level, a drain of the fourteenth transistor receives the first voltage signals, and a source of the fourteenth transistor connects with the N-th level pull-down controlling signals point (P(N));

the n-th level GOA unit further comprises a level module having a second transistor connects with a N-th level gate signals point (Q(N)), a source of the second transistor connects with first clock signals (CK(N)), when the N-th level gate signals point (Q(N)) turns on the second transistor, the first clock signals (CK(N))

operates as the level signals (STN(N)) passing through a drain of the second transistor and then the first clock signals (CK(N)) are transmitted to the GOA unit at the next level; and wherein the N-th level GOA unit comprises a N-th level pull-up controlling module, a N-th level pull-up module, and a N-th level pull-down maintaining module;

an output end of the N-th level pull-up controlling module connects to the N-th level gate signals point (Q(N));

an input end of the N-th level pull-up module connects to the N-th level gate signals point (Q(N)), a control end of the N-th level pull-up module receives the first clock signals (CK(N)), an output end of the N-th level pull-up module connects to the N-th level horizontal scanning line (G(N));

a control end of the N-th level pull-down maintaining module connects with second clock signals (CK(N+1)) or third clock signals (CK(N−1)), and an output end of the N-th level pull-down maintaining module connects to the N-th pull-down controlling signals (P(N)); and wherein the N-th level pull-up controlling module outputs pull-up control signals to the N-th level gate signals point such that, in response to the pull-up control signals, the N-th level pull-up module outputs the first clock signals (CK(N)) to the N-th level horizontal scanning line (G(N)), when the N-th level horizontal scanning line (G(N)) is charged after in response to the first clock signals (CK(N)), the N-th level pull-down maintaining module outputs the second clock signals (CK(N+1)) or the third clock signals (CK(N−1)) to the N-th level pull-down controlling signals point (P(N)), such that the N-th level pull-down module transmits the first voltage signals respectively to the N-th level gate signals point (Q(N)) and the N-th level horizontal scanning line (G(N)) to turn off the N-th level horizontal scanning line (G(N)), the N-th level pull-down maintaining module maintains the N-th level horizontal scanning line (G(N)) to be in an off-state in response to the second clock signals (CK(N+1)) or the third clock signals (CK(N−1));

when in a normal displaying stage, the N-th level pull-up controlling module outputs the pull-up control signals to the N-th level gate signals point (Q(N)); in response to the pull-up control signals, the N-th level pull-up module outputs the first clock signals (CK(N)) to the N-th level horizontal scanning line (G(N)); when the N-th level horizontal scanning line (G(N)) response to the first clock signals (CK(N)), the N-th level pull-down maintaining module outputs the second clock signals (CK(N+1)) or the third clock signals (CK(N−1)) to the N-th level pull-down controlling signals point (P(N)); the N-th level pull-down module transmits the first voltage signals (VH1) to the N-th level gate signals point (Q(N)) and the N-th level horizontal scanning line (G(N)) to turn off the N-th level horizontal scanning line (G(N)); in response to the second clock signals (CK(N+1)) or the third clock signals (CK(N−1)), the N-th level pull-down maintaining module controls the N-th level horizontal scanning line (G(N)) to remain in the off-state.

* * * * *